(12) United States Patent
Ramchen et al.

(10) Patent No.: US 9,029,901 B2
(45) Date of Patent: May 12, 2015

(54) ELECTRONIC COMPONENT

(75) Inventors: Johann Ramchen, Altdorf (DE); Christina Keith, Neutraubling (DE); Bert Braune, Wenzenbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/825,525

(22) PCT Filed: Aug. 19, 2011

(86) PCT No.: PCT/EP2011/064296
§ 371 (c)(1),
(2), (4) Date: Jun. 14, 2013

(87) PCT Pub. No.: WO2012/038164
PCT Pub. Date: Mar. 29, 2012

(65) Prior Publication Data
US 2013/0256737 A1    Oct. 3, 2013

(30) Foreign Application Priority Data

Sep. 21, 2010  (DE) .................. 10 2010 046 122

(51) Int. Cl.
*H01L 33/54* (2010.01)
*H01L 33/56* (2010.01)
*H01L 33/58* (2010.01)
(Continued)

(52) U.S. Cl.
CPC .......... *H01L 33/641* (2013.01); *H01L 31/0203* (2013.01); *H01L 33/56* (2013.01); *H01L 33/58* (2013.01); *H01L 2224/73265* (2013.01)

(58) Field of Classification Search
USPC ............. 257/13, 79–103, 250, 313, 340, 360, 257/438, 918, E51.018–E51.022, 257/E33.001–E33.077, E33.054, E25.028, 257/E25.032; 528/272, 422, 425, 86, 270, 528/308.5, 309.1, 338, 329.7
See application file for complete search history.

(56) References Cited

U.S. PATENT DOCUMENTS 7,880,279 B2    2/2011  Uchida et al.
2001/0015443 A1  8/2001  Komoto
2003/0185526 A1  10/2003 Hö hn et al.
(Continued)

FOREIGN PATENT DOCUMENTS

DE    199 36 605 A1    2/2001
DE    10023353 A1    11/2001
(Continued)

OTHER PUBLICATIONS

"NT-300H: Transparent Sealing Resin for Self-Release-Type Transfer Molding," Nitto Denko Corporation, Electronics Business Division, Semiconducting Material Development, Technical Data Sheet, 2001, pp. 1-10.

*Primary Examiner* — Fernando L Toledo
*Assistant Examiner* — Lawrence-Linh T Nguyen
(74) *Attorney, Agent, or Firm* — Slater & Matsil, L.L.P.

(57) ABSTRACT

An electronic component has a housing body which comprises a semiconductor chip in a recess. The semiconductor chip in the recess is embedded in a casting compound made of a first plastic material having a first glass transition temperature. A cover element made of a second plastic material having a second glass transition temperature is arranged above the recess. The second glass transition temperature is lower than the first glass transition temperature.

20 Claims, 2 Drawing Sheets

(51) Int. Cl.
*H01L 33/64* (2010.01)
*H01L 31/0203* (2014.01)

(56) References Cited

U.S. PATENT DOCUMENTS

| | | | |
|---|---|---|---|
| 2004/0016873 A1 | 1/2004 | Kida et al. | |
| 2007/0181902 A1 | 8/2007 | Uchida et al. | |
| 2007/0182323 A1* | 8/2007 | Ogata et al. | 313/512 |
| 2008/0068845 A1 | 3/2008 | Aida et al. | |
| 2008/0224159 A1 | 9/2008 | Krauter et al. | |
| 2009/0015138 A1 | 1/2009 | Daicho et al. | |
| 2009/0015153 A1* | 1/2009 | Asano | 313/504 |
| 2009/0278147 A1* | 11/2009 | Suzuki | 257/98 |
| 2010/0102461 A1 | 4/2010 | Miyagawa et al. | |
| 2010/0258829 A1 | 10/2010 | Blumel et al. | |

FOREIGN PATENT DOCUMENTS

| | | | |
|---|---|---|---|
| DE | 10 2005 042 778 A1 | | 4/2006 |
| DE | 10 2006 032 428 A1 | | 4/2007 |
| DE | 10 2007 015 474 A1 | | 10/2008 |
| DE | 102008014122 A1 | | 6/2009 |
| DE | 10 2008 021 436 A1 | | 5/2010 |
| JP | 2004111906 A | | 4/2004 |
| JP | 2004512670 A | | 4/2004 |
| JP | 2006-179544 A | | 7/2006 |
| JP | 2006179544 | * | 7/2006 |
| JP | 2006352047 A | | 12/2006 |
| JP | 2007197627 A | | 8/2007 |
| JP | 2008-034546 A | | 2/2008 |
| JP | 2008-041968 A | | 2/2008 |
| KR | 100567559 | | 4/2006 |
| KR | 1020100098661 A | | 9/2010 |
| WO | WO 2008/018336 A1 | | 2/2008 |

* cited by examiner

ELECTRONIC COMPONENT

This patent application is a national phase filing under section 371 of PCT/EP2011/064296, filed Aug. 19, 2011, which claims the priority of German patent application 10 2010 046 122.9, filed Sep. 21, 2010, each of which is incorporated herein by reference in its entirety.

TECHNICAL FIELD

An electronic component is specified.

BACKGROUND

If a semiconductor component such as, for instance, a light-emitting diode (LED) is fixed on a carrier such as, for instance, a printed circuit board by means of a soldering process, then the LED and its component parts are subjected to thermomechanical stresses as a result of the heating required for soldering and the subsequent cooling. If the LED has, for example, a housing comprising a plurality of different plastic parts in which a semiconductor chip is arranged, then the thermomechanical stresses in the housing can act on the semiconductor chip in such a way that the latter is detached or lifted off of a mounting area. This can lead to failure of the LED. In the case of components which comprise, for example, in addition to a material embedding the semiconductor chip, a cover thereabove, the thermal imbalance during heating and cooling and thus the thermomechanical stresses are even additionally intensified, as a result of which the probability of failure also increases for such components.

In order to counter such an effect, it is possible, for example, to achieve the adhesion of the semiconductor chip on the mounting area by means of an adhesive having an increased adhesive capacity. Furthermore, it is possible to use plastic materials, in particular, potting materials, which have a low modulus of elasticity. Thus, a silicone potting, for example, may be used. Furthermore, it is also possible to reduce the thermomechanical stresses by adaptation or optimization of the housing geometry. Furthermore, it can also be attempted to decouple the adhesive with which the semiconductor chip is mounted on the mounting area from the potting material, for example, by means of a suitable form of the adhesive fillets.

However, all these measures result in an, in some instances considerable, increase in the outlay for producing the semiconductor component.

SUMMARY OF THE INVENTION

It is at least one object of specific embodiments to specify an electronic component comprising a semiconductor chip in which the risk of a detachment of the semiconductor chip during a soldering process can be reduced.

In accordance with at least one embodiment, an electronic component comprises a housing body having a depression. A semiconductor chip is arranged in the depression. The housing body can be pre-molded, in particular. That means that, prior to the mounting of the semiconductor chip, the housing body is shaped from a suitable material, for example, a thermoplastic, by means of a molding process such as, for instance, injection molding, transfer molding, or compression molding. The thermoplastic can comprise, for example, polyphthalamide (PPA) or some other suitable plastic material.

Furthermore, the component can comprise a leadframe embedded into the housing body. In particular, the material of the housing body can be molded around the leadframe and the latter can provide a mounting region for the semiconductor chip. Furthermore, the leadframe can provide contact regions outside the housing body for the electronic component, by means of which contact regions the electronic component can be fixed and electrically connected on a carrier, for example, a printed circuit board, by means of a soldering process.

Furthermore, the semiconductor chip can be arranged and thus mounted on the leadframe by means of a connecting material. The connecting material can comprise or be, for example, an electrically conductive adhesive, which can also be designated as a so-called chip adhesive. As an alternative thereto, the connecting material can also comprise or be a solder. For reliable function of the electronic component, it may be necessary for the semiconductor chip to be permanently fixed to the leadframe and electrically connected thereto by means of the connecting material.

Furthermore, the electronic component can be surface-mountable. That can mean, in particular, that the leadframe is embodied in such a way that it provides surface-mountable contact regions on an outer side of the housing body.

In accordance with a further embodiment, the semiconductor chip is an optoelectronic semiconductor chip. In this case, the semiconductor chip can be embodied, in particular, as a light-emitting or as a light-receiving semiconductor chip. In accordance with the desired wavelength range of the light emitted or respectively received by the semiconductor chip, the semiconductor chip can be embodied, for example, as an epitaxial layer sequence, that is to say as an epitaxially grown semiconductor layer sequence, based on an arsenide, phosphide or nitride compound semiconductor material system. Such semiconductor chips are known to the person skilled in the art and will not be explained any further here. As an alternative thereto, the semiconductor chip can, for example, also be embodied as a transistor or as an integrated circuit or as a combination of the semiconductor chips mentioned.

In accordance with a further embodiment, a potting composed of a first plastic material is arranged in the depression of the housing body, the semiconductor chip being embedded into said potting. That can mean, in particular, that the potting directly adjoins the semiconductor chip, for example, at all surface regions at which the connecting material is not arranged. As a result, the semiconductor chip is in direct contact with the potting. Thermomechanical stresses which can occur in the potting can thus act directly on the semiconductor chip.

If the semiconductor chip is embodied, for example, as an optoelectronic semiconductor chip and, in particular, as a light-emitting semiconductor chip, then the plastic material of the potting can be embodied as transparent. Furthermore, the potting can, for example, also comprise a wavelength conversion substance and/or scattering particles embedded into the first plastic material.

In accordance with a further embodiment, a cover element composed of a second plastic material is arranged above the depression. The cover element can be arranged on the potting in order to protect the potting and/or the semiconductor chip. Furthermore, the cover element can also provide additional functionalities for the electronic component. If the semiconductor chip is embodied as an optoelectronic semiconductor chip and, in particular, as a light-emitting semiconductor chip, then the cover element can be embodied for example as an optical element, in particular as a lens, for example. For this purpose, the second plastic material of the cover element can advantageously be transparent, in which case it may also be possible for a wavelength conversion substance and/or scattering particles to be embedded into the second plastic material.

The cover element can be arranged on the potting by means of an adhesive, in particular. That can mean, in particular, that the cover element is fixed on the potting by means of the adhesive. In this case, the adhesive can comprise a material identical to, or at least in the same material class as, the first plastic material of the potting or of the second plastic material of the cover element. Particularly preferably, the adhesive can be an epoxy adhesive which is furthermore arranged in a thin layer between the cover element and the potting and permanently connects the potting to the cover element. Particularly preferably, the adhesive can have properties identical to those of the cover element, in particular, a glass transition temperature identical to that of the cover element. In other words, the adhesive can comprise a plastic material, for example, the second plastic material, having the second glass transition temperature.

In accordance with a further embodiment, the first plastic material has a first glass transition temperature, while the second plastic material has a second glass transition temperature. In this case, the second glass transition temperature is lower than the first glass transition temperature. The glass transition temperature is the temperature at which the first and respectively the second plastic material has a significant change in its deformability. Below the glass transition temperature, the first and respectively the second plastic material can have a low deformability and a rather brittle behavior. At temperatures above the glass transition temperature, the deformability can be characterized by a rather soft, plastically deformable behavior. That can, in particular, also mean that above the glass transition temperature, the first and respectively the second plastic material has in each case a low modulus of elasticity, while below the glass transition temperature, the respective modulus of elasticity is high. Furthermore, the coefficients of thermal expansion can also differ significantly above and below the glass transition temperature.

In accordance with a further embodiment, the first and second plastic materials in each case comprise a thermosetting plastic. By way of example, the first and/or the second plastic material can comprise an epoxy and/or an acrylate. It is particularly advantageous if both the first and the second plastic material in each case comprise an epoxy resin. By means of different additives and/or by means of different degrees of crosslinking in the first and second plastic materials, the latter can in each case have the first and second glass transition temperatures mentioned above.

In the case of known electronic components, plastic materials having the same or at least approximately the same glass transition temperature are usually used for a potting material and a cover material. If such a known electronic component is soldered on, then the individual elements of such a component experience significant temperature differences at least during the cooling process after soldering. While the temperature of the environment is reached very rapidly on the surface of the component, the internal component parts of such a component, that is to say, for example, the potting and the semiconductor chip, are still at a higher temperature. Since plastic materials such as thermosetting plastics, for example, incur severe shrinkage above the glass transition temperature during the cooling process, while they have a significantly smaller temperature-dependent change in expansion below the glass transition temperature, and since, as described above, the moduli of elasticity differ significantly above and below the glass transition temperature, during cooling it can happen that the elements situated further outward, or a region thereof, that is to say, for example, a cover element and, in particular, the top side thereof, is already below the glass transition temperature and thus substantially rigid, while elements in the interior of the component such as, for instance, the potting material are still above the glass transition temperature and thus shrink to an even greater extent in the course of further cooling.

By virtue of the fact that the cover material has already solidified and has assumed a fixed form, at least in the region of the surface, the shrinkage centroid of the overall system composed of cover material and potting material can shift in the direction of the cover material such that tensile stresses are built up between the potting material and the semiconductor chip and between the potting material and the housing body. These tensile stresses often exceed the adhesion forces of a connecting material used to mount the semiconductor chip in the housing body. Consequently in the case of known components in which materials having substantially identical glass transition temperatures are used, delamination of the semiconductor chip can easily occur.

In contrast to known electronic components, in the case of the electronic component described here, the point in time at which the cover element solidifies can be delayed such that the cover element remains in an elastic and deformable state for longer during a cooling process. Shrinkages which take place in the potting as a result of the delayed cooling can thus be compensated for by the cover element for longer. As a result, thermoelastic stresses that can disadvantageously act on the semiconductor chip can advantageously be reduced. Particularly preferably, the first and second glass transition temperatures can be set in such a way that during a customary soldering and cooling process, the solidification of the cover element and of the potting takes place substantially simultaneously.

In accordance with a further embodiment, the first glass transition temperature is greater than or equal to 120° C. Furthermore, the first glass transition temperature can be less than or equal to 150° C. That can mean, in particular, that the first glass transition temperature is in a range of between 120° C. and 150° C., wherein the limits can be concomitantly included.

In accordance with a further embodiment, the second glass transition temperature is lower than the first glass transition temperature and is, in particular, less than or equal to 120° C. or else less than 120° C. Particularly preferably, the second glass transition temperature can be less than or equal to 110° C. Furthermore, the second glass transition temperature can be greater than or equal to 80° C. That can mean that the second glass transition temperature is in a range of between 80° C. and 120° C. and preferably between 80° C. and 110° C., wherein the limits can be concomitantly included.

In the case of the electronic component described here, by virtue of the adaptation of the first and second glass transition temperatures with respect to one another, an improved thermomechanical behavior during the soldering process, in particular, for surface-mountable electronic components, can be possible. In particular, it may be possible to reduce the mechanical stress on the semiconductor chip during the soldering process and during subsequent cooling, and thus, to prevent a delamination of the semiconductor chip from a leadframe or from the housing body. This may be possible, in particular, by virtue of the fact that during the soldering process and during the subsequent cooling process, lower tensile forces within the component and in this case, in particular, within the depression of the housing body, act on the chip such that the semiconductor chip can be prevented from being lifted off of the mounting area.

BRIEF DESCRIPTION OF THE DRAWINGS

Further advantages and advantageous embodiments and developments will become apparent from the embodiments described below in conjunction with FIGS. 1 to 4.

In the exemplary embodiments and figures, identical or identically acting constituent parts may, in each case, be provided with the same reference signs. The illustrated elements and their size relationships among one another should not be regarded as true to scale, in principle; rather, individual elements such as, for example, layers, structural parts, components and regions may be illustrated with exaggerated thickness or size dimensions in order to enable better illustration and/or in order to afford a better understanding.

DETAILED DESCRIPTION OF ILLUSTRATIVE EMBODIMENTS

Figure 1:
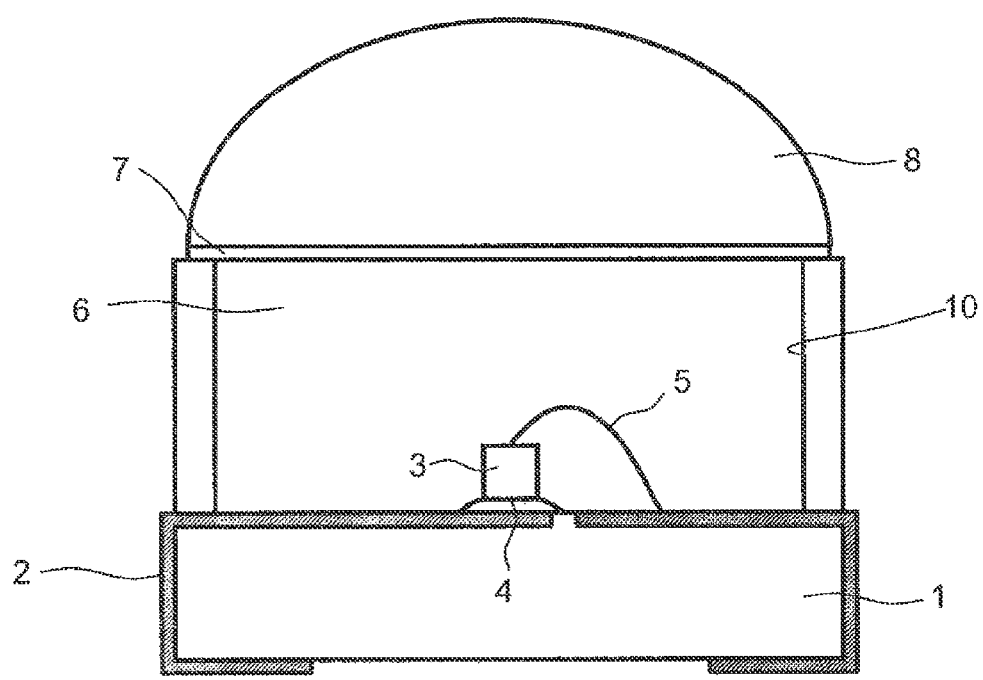
FIGS. 1 to 3 show schematic illustrations of electronic components in accordance with different exemplary embodiments.

FIG. 1 shows an exemplary embodiment of an electronic component comprising a housing body 1. The housing body 1 has a depression 10, in which a semiconductor chip 3 is arranged. Purely by way of example, in the present exemplary embodiment and also in the following exemplary embodiments, the electronic component shown in each case is embodied as an optoelectronic component comprising an optoelectronic semiconductor chip and, in particular, a light-emitting semiconductor chip.

In the present exemplary embodiment, the housing body 1 comprises a thermoplastic, for example, polyphthalamide (PPA), and is shaped by means of a molding process, for example, injection molding. During the production of the housing body 1, a leadframe 2 is provided, around which the material of the housing body 1 is molded. In this case, the housing body 1 and the leadframe 2 are embodied in such a way that, as shown in FIG. 1, the electronic component is surface-mountable.

The semiconductor chip 3 is fixed on the leadframe 2 and thus on the housing body 1 in the depression 10 by means of a connecting material 4, preferably by means of an electrically conductive adhesive in the exemplary embodiment shown. A top side of the semiconductor chip 3 is electrically connected to the leadframe 2 by means of a bonding wire 5, for example, a gold wire.

As an alternative to the embodiment of the housing body 1 described here, for example, the housing body 1, the leadframe 2 and the semiconductor chip 3 can also have other materials, geometries, arrangements and embodiments.

A potting 6 composed of a first plastic material is arranged in the depression 10 of the housing body 1, a semiconductor chip 3 being embedded in said potting. In the exemplary embodiment shown, the potting 6 in this case completely fills the depression 10. As an alternative thereto, it may also be possible that the potting 6 only partly fills the depression 10. In other words, the potting 6 does not extend as far the upper edge of the depression 10.

A cover element 8 composed of a second plastic material is arranged above the depression 10. In this case, in the exemplary embodiment shown, the cover element 8 is embodied as a lens which is pre-molded and prefabricated prior to being applied to the potting 6 and which is arranged on the potting and fixed thereto by means of an adhesive 7. The potting 6 is also cured before the cover element 8 is applied.

The first plastic material of the potting 6 and the second plastic material of the cover element 8 are in each case produced from a transparent thermosetting plastic, in particular, in each case from an epoxy resin in the exemplary embodiment shown. In this case, the first plastic material has a first glass transition temperature which is in a range of between 120° C. and 150° C., while the second plastic material has a second glass transition temperature which is lower than the first glass transition temperature. In particular, in the exemplary embodiment shown, the second glass transition temperature is in a range of between 80° C. and 110° C.

The different glass transition temperatures of the first and second plastic materials can be achieved by means of additives to the respective epoxy resin and/or by means of different degrees of crosslinking of the materials during the respective curing.

In particular, it can also be advantageous if the adhesive 7 has properties identical to those of the cover element 8, in particular, a glass transition temperature identical to that of the cover element 8. For this purpose, by way of example, the second plastic material of the cover element 8 can be applied as adhesive 7.

Figure 2:
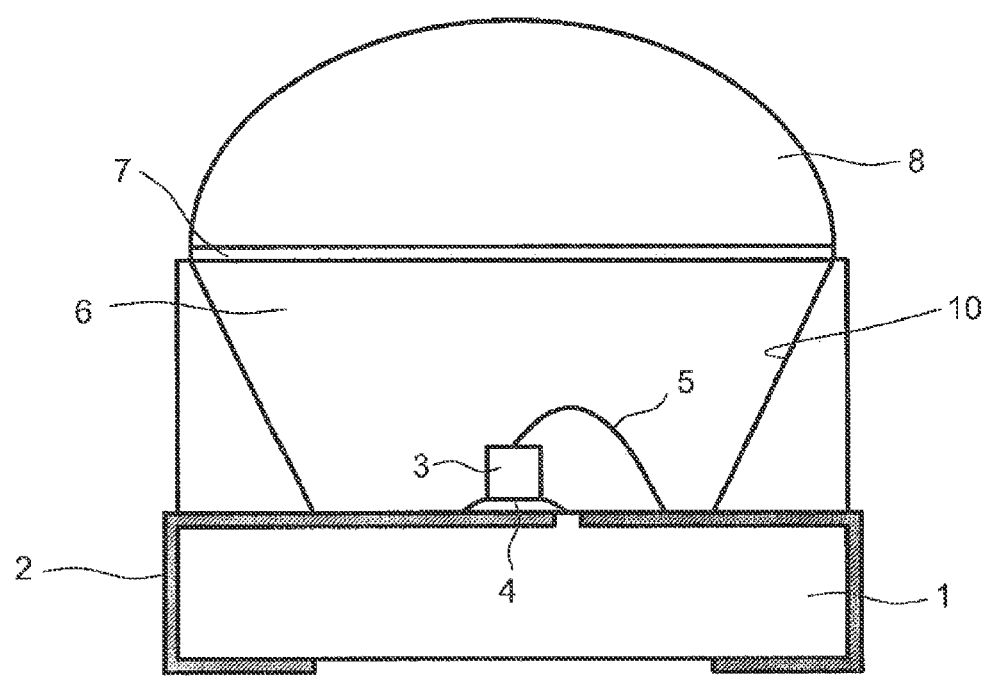
Figure 3:
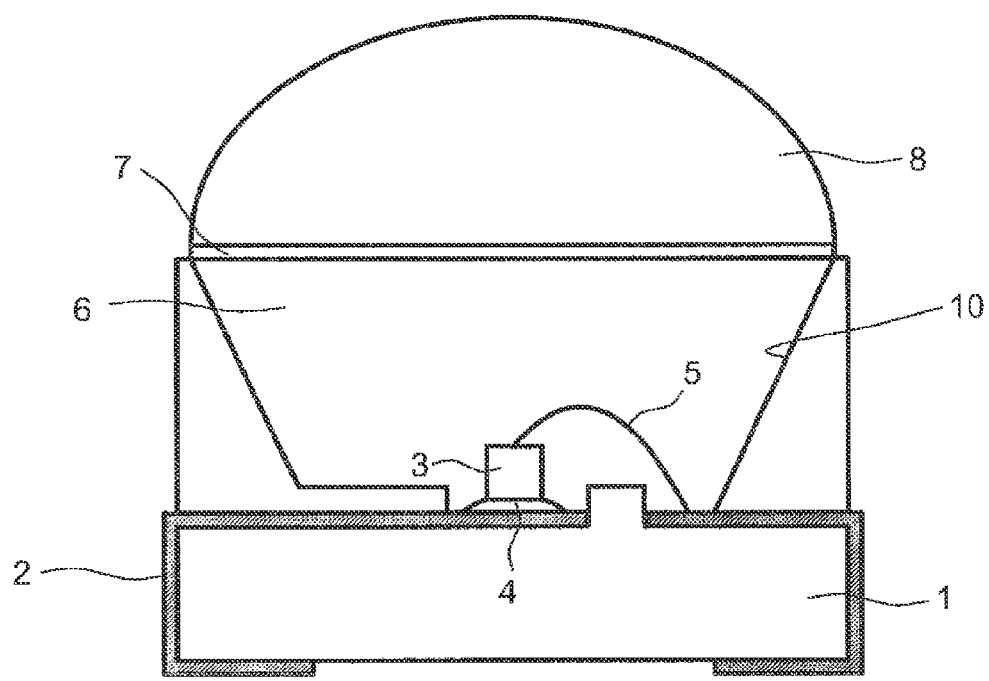

FIGS. 2 and 3 show further exemplary embodiments of electronic components which, in comparison with the exemplary embodiment in accordance with FIG. 1, have a depression 10 shaped as a reflector in the housing body 1. As a result, in particular in the case of an electronic component comprising a light-emitting semiconductor chip 3, an increase in the emission of the light emitted in the semiconductor chip 3 in a forward direction can be made possible.

The housing body of the electronic component in accordance with the exemplary embodiment in FIG. 3 is furthermore embodied in such a way that the depression 10, in particular, the bottom surface of the depression 10 apart from mounting and connection regions for the semiconductor chip 3 and the bonding wire 5, are covered by the housing body material such that the reflectivity of the depression 10 shaped as a reflector is increased even further.

Figure 4:
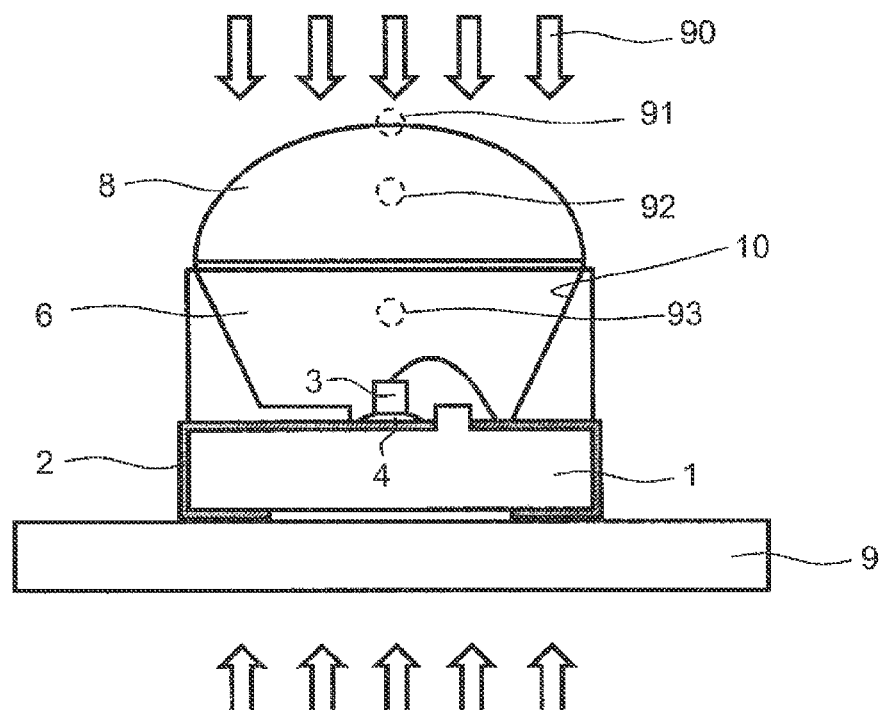
FIG. 4 shows a schematic illustration of a cooling process after a soldering process of an electronic component in accordance with a further exemplary embodiment.

FIG. 4 shows, purely by way of example, the electronic component in accordance with the exemplary embodiment from FIG. 3 which is soldered on a circuit board or a printed circuit board 9 by means of, purely by way of example, a customary soldering process.

For this purpose, the component and the printed circuit board 9 are heated to a maximum temperature (peak temperature) of usually greater than or equal to 240° C. and less than or equal to 270° C. and typically of 260° C., at which a solder arranged between the printed circuit board 9 and the leadframe 2 of the electronic component melts and thus, enables the component to be mounded and fixed on the printed circuit board 9. The component is subsequently cooled to 165° C.

From the temperature of 165° C., the component is cooled directly to room temperature at a cooling rate of usually six kelvins per seconds. In this case, cooling air is blown onto the component on the printed circuit board 9 from the top side and underside, as is indicated by means of the arrows 90. In this time range, the individual elements of the electronic component experience significant temperature differences. While the temperature of the cooling air is reached very rapidly on the surface of the component in the region marked by 91 on account of the active cooling, the internal component parts, for instance in the region 93, such as, for instance, the potting 6 but also the semiconductor chip 3 and the connecting material 4, are still at a higher temperature. During cooling, however, the plastic materials in each case experience shrinkage. The first and second plastic materials, which comprise an epoxy resin in the exemplary embodiment shown, in each case experience severe shrinkage above the glass transition temperature, while below the glass transition temperature, the temperature-dictated expansion of the respective material is lower by orders of magnitude. Furthermore, the modulus of elasticity of the respective plastic material changes greatly during the transition of the glass transition temperature. Below the glass transition temperature, the modulus of elasticity is high, for example, greater than 1 GPa in the case of epoxy resins, which is reflected in a rigid structure of the material. Above the glass transition temperature, the epoxy resins soften and the modulus of elasticity decreases, typically to values of less than 1 MPa. Furthermore, the change in the respective coefficients of expansion cannot be disregarded during the transition or undershooting of the glass transition temperature. Epoxy resins typically have a coefficient of thermal expansion of 60 to 70 ppm/K below the glass transition temperature, while the coefficient of expansion is approximately 160 to 170 ppm/K above the glass transition temperature.

In order to illustrate the advantageous effect of the electronic component described here, a description is given below firstly of the effect of the cooling process on a conventional component comprising a potting or a cover element each comprising materials having approximately the same glass transition temperature. In this case, it is assumed, purely by way of example, that the respective glass transition temperature is approximately 130° C.

During the heating process up to the peak temperature in the soldering process, the respective materials, that is to say the material of the housing body, of the potting and of the cover element, expand greatly relative to the state at room temperature. The materials, in turn, shrink in the cooling phase. In this case, a situation can occur in which the cover element is already at a temperature below its glass transition temperature, while the potting material is still above the glass transition temperature. This can have the effect that the surface of the cover element has already solidified and has a high modulus of elasticity, while the interior of the cover element and the potting material are still above the glass transition temperature. That means that the surface of the cover element has already solidified at a point in time at which the cover element still has a higher volume relative to its state at room temperature. This gives rise to the effect that the material of the cover element contracts, that is to say shrinks, as a result of the further cooling and attempts to reduce its volume. By virtue of the fact that the surface of the color element has already solidified and assumed a fixed form, the shrinkage centroid of the entire system composed of potting, adhesive and cover element changes and is shifted in the direction of the surface of the cover element. That furthermore means, at the same time, that the respective material of the connection areas—opposite the surface of the cover element—between the potting and the leadframe, the potting and the semiconductor chip and the potting and the chip adhesive, a tensile stress is built up. Said tensile stress often exceeds the adhesion forces of the potting at the leadframe such that a delamination of the potting material can be observed here. If the tensile forces are higher than the adhesion forces between the semiconductor chip and the chip adhesive or the chip adhesive and the leadframe, this leads to the delamination of the semiconductor chip from the leadframe, thus giving rise to an open electrical contact in the component, which leads to the failure of the component.

In contrast to this effect that occurs in the case of known components, it is possible to prevent the semiconductor chip 3 from being lifted off of the mounting area during or after the soldering process and the cooling process by virtue of the fact that the thermal imbalance is counteracted by a suitable choice of the first and second plastic materials and the corresponding glass transition temperatures. By virtue of the fact that the second plastic material has the second glass transition temperature that is lower than the first glass transition temperature of the first plastic material, what can be achieved is that the potting 6 falls below the first glass transition temperature earlier or at the same time when the cover element 8 also falls below the second glass transition temperature, as a result of which the cover element 8 exerts less mechanical stress on the potting 6 and thus on the semiconductor chip 3.

When proceeding from the known component in which the glass transition temperature of the cover element and that of the potting are approximately identical, different temperatures prevail in the regions 91, 92 and 93 shown in FIG. 4 during the cooling process, wherein the temperature in the region 91 is lower than the temperature in the region 92, which is in turn lower than the temperature in the region 93. If the temperature in the region 91 falls below the glass transition temperature, that is to say, for example, in the case of a glass transition temperature of 130° C. below this temperature, the top side of the cover element has already solidified, while—as described above—in the regions 92 and 93 the cover element and respectively the potting may still be at a temperature above the glass transition temperature and may thus shrink even further.

In the case of the electronic component described here having a second glass transition temperature that is lower than the first glass transition temperature, a first glass transition temperature of the potting 6 of approximately 130° C. and a second glass transition temperature of the cover element 8 of approximately 100° C. are assumed purely by way of example below. As long as the temperature in the region 91 is higher than 100° C., the surface of the cover element 8 has not yet solidified. It is only when the temperature in the region 91 falls below the second glass transition temperature of 100° C. that the surface of the cover element 8 has solidified. As long as the temperature in the region 92, that is to say in the interior of the cover element 8, is still above 100° C., the second plastic material of the cover element 8 still shrinks in this region. If the first plastic material in the region 93 is below a temperature of 130° C. but still above a temperature of 100° C., then the potting 6, that is to say the first plastic material, has already solidified on account of the first transition temperature of 130° C. If it is assumed, for example, that a temperature of 120° C. prevails both in the region 92 and in the region 93, the potting 6 has already solidified, while the cover element 8 is still above the second glass transition temperature. Even if the cover element 8 shrinks still further in the region 92, the forces which act on the semiconductor chip 3 or on the respective interfaces between the potting 6, the semiconductor chip 3, the connecting material 4, the leadframe 2 and the housing material 1 can thus be considerably reduced. As a result, it is possible to counteract the thermal imbalance during cooling after a soldering process and thus, to avoid the delamination of the semiconductor chip 3.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An electronic component comprising:
   a housing body:
   a semiconductor chip arranged in a depression within the housing body, wherein the semiconductor chip is embedded in a potting composed of a first plastic material having a first glass transition temperature; and
   a cover element arranged above the depression, wherein the cover element is composed of a second plastic material having a second glass transition temperature, and the second glass transition temperature is lower than the first glass transition temperature,
   wherein the first glass transition temperature is in a range between 120° C. and 150° C.; and
   wherein the second glass transition temperature is in a range between 80° C. and 120° C.

2. The electronic component according to claim 1, wherein the first and second plastic materials each comprise a thermosetting plastic.

3. The electronic component according to claim 2, wherein the first and second plastic materials each comprise an epoxy resin.

4. The electronic component according to claim 1, wherein the first glass transition temperature is in a range between 120° C. and 150° C.

5. The electronic component according to claim 1, wherein the second glass transition temperature is in a range between 80° C. and 120° C.

6. The electronic component according to claim 1, wherein the cover element is arranged on the potting by an adhesive.

7. The electronic component according claim 6, wherein the adhesive and the cover element have an identical glass transition temperature.

8. The electronic component according to claim 1, further comprising a leadframe embedded into the housing body, wherein the semiconductor chip is mounted to the leadframe by a connecting material.

9. The electronic component according to claim 1, wherein the housing body comprises a thermoplastic material.

10. The electronic component according to claim 9, wherein the thermoplastic material comprises polyphthalamide.

11. The electronic component according to claim 1, wherein the housing body is surface-mountable.

12. The electronic component according to claim 1, wherein the semiconductor chip is an optoelectronic semiconductor chip.

13. The electronic component according to claim 12, wherein the optoelectronic semiconductor chip is a light-emitting semiconductor chip.

14. An electronic component comprising:
   a housing body;
   a semiconductor chip arranged in a depression within the housing body, wherein the semiconductor chip is embedded into a potting composed of a first plastic material having a first glass transition temperature; and
   a cover element arranged above the depression, wherein
      the cover element is composed of a second plastic material having a second glass transition temperature,
      the first and the second plastic materials comprise and epoxy resin and
      the housing body comprises polyphthalamide;
      wherein the first glass transition temperature is in a range between 120° C. and 150° C.; and
      wherein the second glass transition temperature is in a range between 80° C. and 120° C.

15. The electronic component according to claim 14, further comprising a leadframe embedded into the housing body, wherein the semiconductor chip is mounted to the leadframe by a connecting material.

16. The electronic component according to claim 14, wherein the cover element is arranged on the potting by an adhesive.

17. An electronic component comprising:
   a housing body;
   a semiconductor chip arranged in a depression within the housing body, wherein the semiconductor chip is embedded into a potting composed of a first plastic material having a first glass transition temperature; and
   a cover element arranged above the depression, wherein
   the cover element is composed of a second plastic material having a second glass transition temperature,
   the second glass transition temperature is lower than the first glass transition temperature,
   the first glass transition temperature is in a range of between 120° C. and 150° C.; and
   the second glass transition temperature is in a range of between 80° C. and 120° C.

18. The electronic component according to claim 17, wherein the housing body comprises a thermoplastic material.

19. The electronic component according to claim 18, wherein the thermoplastic material comprises polyphthalamide.

20. The electronic component according to claim 17, wherein the housing body is surface-mountable.

* * * * *

UNITED STATES PATENT AND TRADEMARK OFFICE
CERTIFICATE OF CORRECTION

| | | |
|---|---|---|
| PATENT NO. | : 9,029,901 B2 | Page 1 of 1 |
| APPLICATION NO. | : 13/825525 | |
| DATED | : May 12, 2015 | |
| INVENTOR(S) | : Johann Ramchen et al. | |

It is certified that error appears in the above-identified patent and that said Letters Patent is hereby corrected as shown below:

In the Claims

In Col. 10, line 13, claim 4, delete "plastic materials comprise and" and insert --plastic materials comprise an--.

Signed and Sealed this
Tenth Day of November, 2015

Michelle K. Lee
*Director of the United States Patent and Trademark Office*